United States Patent
Tsukao et al.

(10) Patent No.: US 9,253,911 B2
(45) Date of Patent: Feb. 2, 2016

(54) ANISOTROPIC CONDUCTIVE MATERIAL AND METHOD FOR MANUFACTURING SAME

(75) Inventors: Reiji Tsukao, Tochigi (JP); Tomoyuki Ishimatsu, Tochigi (JP); Hiroki Ozeki, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 181 days.

(21) Appl. No.: 13/702,485

(22) PCT Filed: Nov. 30, 2011

(86) PCT No.: PCT/JP2011/077689
§ 371 (c)(1),
(2), (4) Date: Feb. 11, 2013

(87) PCT Pub. No.: WO2012/074015
PCT Pub. Date: Jun. 7, 2012

(65) Prior Publication Data
US 2013/0135838 A1 May 30, 2013

(30) Foreign Application Priority Data
Dec. 2, 2010 (JP) .................. 2010-269422

(51) Int. Cl.
*H05K 7/04* (2006.01)
*H01R 43/00* (2006.01)
(Continued)

(52) U.S. Cl.
CPC .. *H05K 7/04* (2013.01); *H01B 1/08* (2013.01); *H01B 1/10* (2013.01); *H01B 1/20* (2013.01);
(Continued)

(58) Field of Classification Search
None
See application file for complete search history.

(56) References Cited

U.S. PATENT DOCUMENTS

2004/0110895 A1* 6/2004 Anderson et al. ............. 524/588
2006/0276584 A1* 12/2006 Todoroki et al. ............. 524/588
(Continued)

FOREIGN PATENT DOCUMENTS

JP    A-2002-322348    11/2002
JP    A-2005-75983    3/2005
(Continued)

OTHER PUBLICATIONS

Materne et al. "Organosilane Technology in Coating Applications: Review and Perspectives," Dow Corning Corporation, copyright 2006, attached as a PDF.*
(Continued)

*Primary Examiner* — Khanh Tuan Nguyen
*Assistant Examiner* — Katie L Hammer
(74) *Attorney, Agent, or Firm* — Oliff PLC

(57) ABSTRACT

The present invention provides an anisotropic conductive material in which lower continuity resistance and higher adhesive strength are obtained, and a method for manufacturing the same. When a glass substrate and a metal wiring material are thermally compressed and bonded, in an interface between the glass substrate and an anisotropic conductive material, Si on a surface of the glass substrate reacts on an alkoxyl group (OR) at an end of disulfide silane modified by hydrophobic silica, and chemically binds thereto. Furthermore, at an interface between the metal wiring material and the anisotropic conductive material, a part of S—S bonds (disulfide bonds) in disulfide silane dissociates due to the heat at the time of thermocompression bonding, and the dissociated sulfide silane chemically binds to metal Me.

7 Claims, 2 Drawing Sheets

HYDROPHOBIC SILICA
(DIETHYL SILOXANE MODIFICATION)

SULFIDE SILANE COUPLING AGENT

(51) Int. Cl.
*H01B 1/10* (2006.01)
*H01B 1/08* (2006.01)
*H01B 1/20* (2006.01)
*H01L 23/00* (2006.01)
*H01R 4/04* (2006.01)
*H05K 3/32* (2006.01)

(52) U.S. Cl.
CPC *H01L 24/29* (2013.01); *H01R 4/04* (2013.01); *H01R 43/00* (2013.01); *H05K 3/323* (2013.01); *H01L 2224/29* (2013.01); *H01L 2224/2919* (2013.01); *H01L 2224/2929* (2013.01); *H01L 2224/29198* (2013.01); *H01L 2224/29344* (2013.01); *H01L 2224/29347* (2013.01); *H01L 2224/29355* (2013.01); *H01L 2224/29386* (2013.01); *H01L 2924/00013* (2013.01); *H01L 2924/0103* (2013.01); *H01L 2924/01005* (2013.01); *H01L 2924/0105* (2013.01); *H01L 2924/01006* (2013.01); *H01L 2924/01029* (2013.01); *H01L 2924/01033* (2013.01); *H01L 2924/01049* (2013.01); *H01L 2924/01079* (2013.01); *H01L 2924/0665* (2013.01); *H01L 2924/07802* (2013.01); *H01L 2924/15788* (2013.01); *H05K 2201/0209* (2013.01); *H05K 2201/0239* (2013.01); *Y10T 29/49117* (2015.01)

(56) References Cited

U.S. PATENT DOCUMENTS

| | | | |
|---|---|---|---|
| 2009/0130306 A1* | 5/2009 | Yoo | C09C 1/3081 427/220 |
| 2010/0327237 A1 | 12/2010 | Takai et al. | |
| 2014/0309343 A1* | 10/2014 | Venema | B01J 2/00 524/71 |

FOREIGN PATENT DOCUMENTS

| | | |
|---|---|---|
| JP | 2006096641 A * | 4/2006 |
| JP | A-2006-196850 | 7/2006 |
| JP | A-2009-212077 | 9/2009 |
| JP | A-2009-280790 | 12/2009 |
| JP | A-2010-84019 | 4/2010 |
| JP | A-2010-171023 | 8/2010 |
| JP | A-2010-232191 | 10/2010 |
| WO | WO 2009109442 A2 * | 9/2009 |

OTHER PUBLICATIONS

English text machine translation of Aoki et al. (JP 2006-096641 A), accessed on the JPO AIPN website and attached as a PDF.*
English text Derwent abstract of Aoki et al. (JP 2006-096641 A), Derwent abstract Acc-No. 2006-287215, attached as a PDF.*
SiSiB® PC2200 technical information from Power Chemical Corporation, copyright 1989-2009, copy attached to the case file as a PDF, available online at http://www.orgsi.com/2200.html , pp. 1-3.*
International Search Report issued in International Application No. PCT/JP2011/077689 on Feb. 7, 2012 (with translation).

* cited by examiner

US 9,253,911 B2

ANISOTROPIC CONDUCTIVE MATERIAL AND METHOD FOR MANUFACTURING SAME

FIELD OF THE INVENTION

This invention relates to an anisotropic conductive material in which conductive particles are dispersed, and to a method for manufacturing the same. The present application asserts priority rights based on JP Patent Application 2010-269422 filed in Japan on Dec. 2, 2010. The total contents of disclosure of the patent application of the senior filing date are to be incorporated by reference into the present application.

BACKGROUND OF THE INVENTION

Conventionally, a method of mounting a part, such as a semiconductor, on a substrate by using an anisotropic conductive film (ACF) has been applied. In the case where the ACF is used for a glass substrate, a silane coupling agent is used in order to improve adhesive strength between an adhesive component and a glass, but, when left standing, the silane coupling agent bleeds out to a surface of the ACF film and volatilizes. Therefore, there has been used a method of modifying silica with a silane coupling agent to control the volatilization (For example, refer to PTL 1 to 3).

PRIOR-ART DOCUMENTS

Patent Document

PTL 1: Japanese Patent Application Laid-Open No. 2005-75983
PTL 2: Japanese Patent Application Laid-Open No. 2010-84019
PTL 3: Japanese Patent Application Laid-Open No. 2006-196850

SUMMARY OF THE INVENTION

However, the silica which is usually used in the method of modifying silica with a silane coupling agent has a hydroxyl group on the surface thereof, and thereby is hydrophilic, and therefore, dispersibility is low, and low continuity resistance and high adhesive strength are not obtained.

The present invention is proposed in view of such actual circumstances, and provides an anisotropic conductive material by which low continuity resistance and high adhesive strength are obtained, and provides a method for manufacturing the same.

The present inventors earnestly studied, and consequently found that, by using hydrophobic silica in which organic modification is provided on the surface of silica, silica particles in each of which this hydrophobic silica is surface-treated with a disulfide silane coupling agent is mixed with an anisotropic conductive material, whereby low continuity resistance and high adhesive strength are obtained.

That is, an anisotropic conductive material according to the present invention contains silica particles in each of which a surface of hydrophobic silica is surface-treated with a disulfide silane coupling agent.

Also, a method for manufacturing the anisotropic conductive material according to the present invention is characterized in that a surface of hydrophobic silica is surface-treated with a disulfide silane coupling agent and said surface-treated silica particles are made to be contained.

EFFECTS OF INVENTION

According to the present invention, an anisotropic conductive material is made to contain sulfide silane modified hydrophobic silica, whereby, high adhesive strength can be obtained, Furthermore, dispersibility of the sulfide silane modified hydrophobic silica can be improved, whereby low continuity resistance can be obtained.

DETAILED DESCRIPTION OF THE INVENTION

Hereinafter, an embodiment of the present invention will be described in detail in the following order.
1. Anisotropic conductive material
2. Manufacturing method of anisotropic conductive material
3. Connection method
4. Examples 1. Anisotropic Conductive Material An anisotropic conductive material shown as an example of the present invention contains silica particles in each of which a surface of hydrophobic silica is surface-treated with a disulfide silane coupling agent (hereinafter, referred to as sulfide silane modified hydrophobic silica).

First, the sulfide silane modified hydrophobic silica will be explained. The sulfide silane modified hydrophobic silica is obtainable by surface-treating a surface of hydrophobic silica with a disulfide silane coupling agent.

Figure 1:
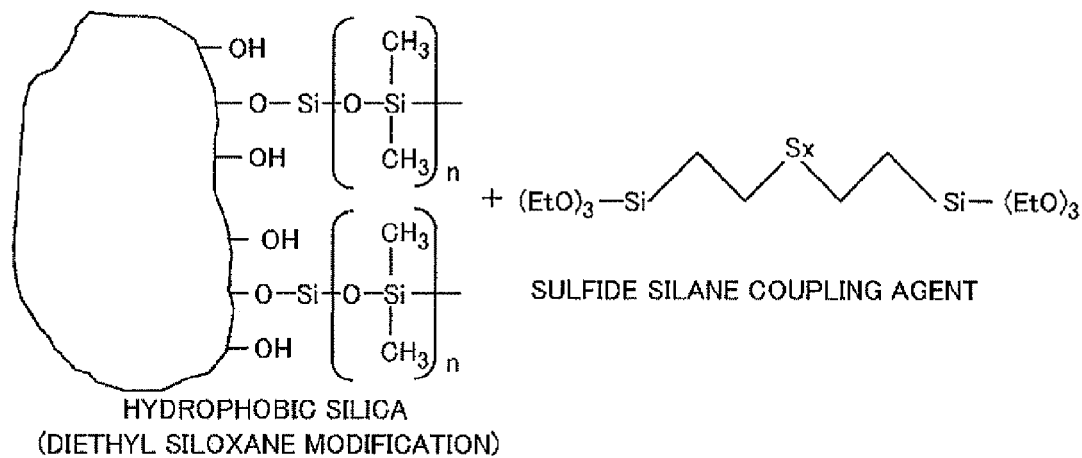
FIG. 1 is a simplified diagram illustrating a reaction between hydrophobic silica and a disulfide silane coupling agent.

FIG. 1 is a simplified diagram illustrating a reaction between the hydrophobic silica and the disulfide silane coupling agent. In this reaction example, the hydrophobic silica is dimethyl siloxane modified silica in which a surface of silica is modified with dimethyl siloxane, while the disulfide silane coupling agent is disulfide silane which has a disulfide bond (S—S bond) and has an ethoxy group (EtO) at an end thereof.

Figure 2:
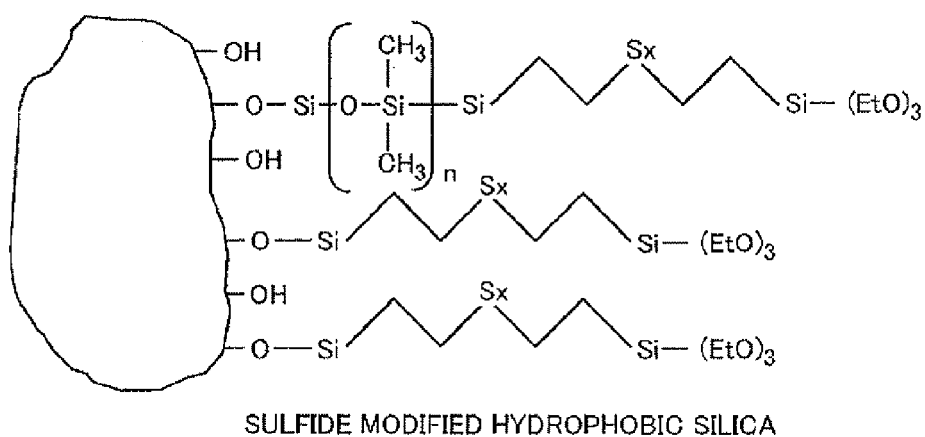
FIG. 2 is a simplified diagram illustrating sulfide silane modified hydrophobic silica.

As shown in FIG. 1, organic modification is not completely performed for Si on the surface of the hydrophobic silica, and an unmodified hydroxyl group (OH) exists. Therefore, as shown in FIG. 2, an unmodified hydroxyl group (OH) of the hydrophobic silica can bind to an alkoxyl group (OR) of disulfide silane. Moreover, Si at an end of a dimethyl siloxane can bind to an alkoxyl group (OR) of disulfide silane. Thus, the hydrophobic silica is modified with disulfide silane, whereby the disulfide silane coupling agent can be prevented from bleeding out from the anisotropic conductive material.

Figure 3:
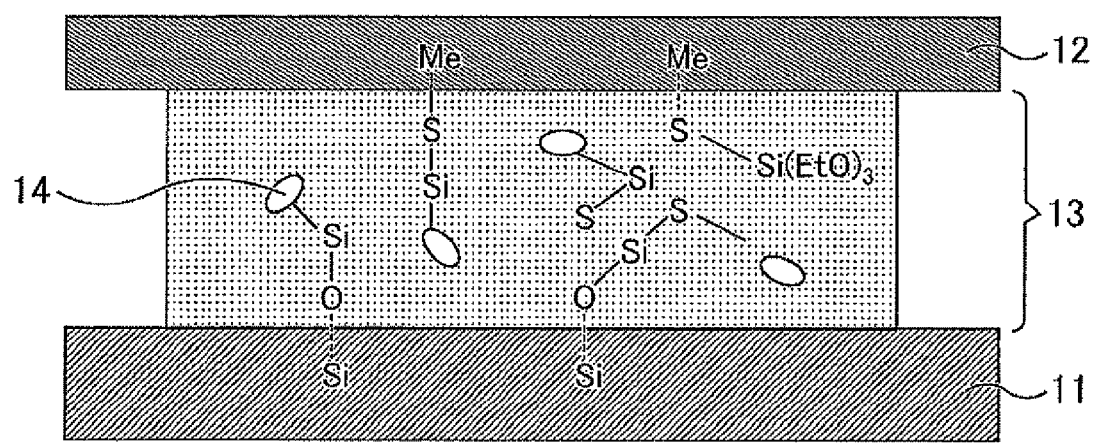
FIG. 3 is a schematic diagram illustrating a reaction when a glass substrate and a metal wiring material are thermally compressed and bonded via an anisotropic conductive material.

FIG. 3 is a schematic diagram illustrating a reaction when a glass substrate and a metal wiring material are thermally compressed and bonded via an anisotropic conductive material. When a glass substrate 11 and a metal wiring material 12 are thermally compressed and bonded, in an interface between the glass substrate 11 and the anisotropic conductive material 13, Si in the surface of the glass substrate 11 reacts on an alkoxyl group (OR) at an end of disulfide silane modified by hydrophobic silica 14, and chemically binds thereto. Thus, the adhesiveness (adhesive strength) between the anisotropic conductive material 13 and the glass substrate 11 can be improved.

Furthermore, at an interface between the metal wiring material 12 and the anisotropic conductive material 13, a part of S—S bonds (disulfide bonds) in the disulfide silane dissociates due to the heat in thermocompression bonding, and dissociated sulfide silane resulting from the dissociation chemically binds to metal Me. Thus, the adhesiveness (adhesive strength) of the anisotropic conductive material 13 and the metal wiring material 12 can be improved.

Thus, an anisotropic conductive material is made to contain sulfide silane modified hydrophobic silica, whereby excellent adhesive strength can be obtained at the interface between the anisotropic conductive material 13 and the glass substrate 11, and at the interface between the anisotropic conductive material 13 and the metal wiring material 12. Furthermore, sulfide silane modified hydrophobic silica is hydrophobic, thereby capable of improving the dispersibility in the anisotropic conductive material, and accordingly excellent continuity resistance can be obtained.

The sulfide silane modified hydrophobic silica is applicable to any of a radical polymerizable adhesive and a cationic polymerizable adhesive. Among these, a radical polymerizable adhesive generally has high cure shrinkage and high internal stress, and adhesive strength tends to decrease, and therefore, by containing the sulfide silane modified hydrophobic silica, the above-mentioned effects remarkably show up.

Hereinafter, an example of an anisotropic conductive material in which a radical polymerizable adhesive is made to contain sulfide silane modified hydrophobic silica will be explained. The anisotropic conductive material in the present embodiment contains sulfide silane modified hydrophobic silica, a film formation resin, a radical polymerizable substance, a curing agent, and conductive particles.

The sulfide silane modified hydrophobic silica is such that, as mentioned above, the surface of hydrophobic silica is surface-treated with a disulfide silane coupling agent. The hydrophobic silica is such that organic modification is carried out for the surface of silica, and has hydrophobicity. A compound to be used for performing organic modification for the surface of silica is not particularly limited, but dimethyl siloxane or trimethyl siloxane is preferably used. An average particle diameter of the hydrophobic silica is 10 to 1000 nm, in particular, preferably 10 to 500 nm, more preferably 10 to 300 nm.

A content of the sulfide silane modified hydrophobic silica is preferably 2 to 15 parts by mass with respect to 100 parts by mass of the anisotropic conductive composite. When the content is not less than 2 parts by mass with respect to 100 parts by mass of the anisotropic conductive composite, an effect of improvement in connection strength can be obtained, while when the content is not more than 15 parts by mass, an effect of improvement in continuity resistance can be obtained.

As the disulfide silane coupling agent, disulfide silane, which has a disulfide bond (S—S bond) and has an alkoxyl group (RO) as an end group, is preferably used. Here, examples of the "alkoxyl group" include a straight or branched chain alkoxyl group containing from 1 to 20 carbon atoms, such as methoxy, ethoxy, propoxy, butoxy, pentyloxy, hexyloxy, methoxyethoxy, methoxypropoxy, ethoxyethoxy, ethoxypropoxy, or methoxyethoxyethoxy groups, and the like.

Examples of the disulfide silane coupling agent include bis(3-triethoxysilylpropyl)disulfide, bis(2-triethoxysilylethyl)disulfide, bis(4-triethoxysilylbutyl)disulfide, bis(3-trimethoxysilylpropyl)disulfide, bis(2-trimethoxysilylethyl)disulfide, bis(4-trimethoxysilylbutyl)disulfide, bis(3-methyldiethoxysilylpropyl)disulfide, bis(2-methyldiethoxysilylpropyl)disulfide, bis(4-methyldiethoxysilylpropyl)disulfide, bis(3-methyldimethoxysilylpropyl)disulfide, bis(2-methyldimethoxysilylbutyl)disulfide, bis(4-methyldimethoxysilylbutyl)disulfide, bis(3-triethoxysilylpropyl)trisulfide, bis(2-triethoxysilylethyl)trisulfide, bis(4-triethoxysilylbutyl)trisulfide, bis(3-trimethoxysilylpropyl)trisulfide, bis(2-trimethoxysilylethyl)trisulfide, bis(4-trimethoxysilylbutyl)trisulfide, bis(3-triethoxysilylpropyl)tetrasulfide, bis(2-triethoxysilylethyl)tetrasulfide, bis(4-triethoxysilylbutyl)tetrasulfide, bis(3-trimethoxysilylpropyl)tetrasulfide, bis(2-trimethoxysilylethyl)tetrasulfide, bis(4-trimethoxysilylbutyl)tetrasulfide, bis(3-methyldiethoxysilylpropyl)tetrasulfide, bis(2-methyldiethoxysilylethyl)tetrasulfide, bis(4-methyldiethoxysilylbutyl)tetrasulfide, bis(3-methyldimethoxysilylpropyl)tetrasulfide, bis(2-methyldimethoxysilylethyl)tetrasulfide, and bis(4-methyldimethoxysilylbutyl)tetrasulfide; and these may be used alone, or two or more kinds of these may be used in combination. Among these, bis(3-triethoxysilylpropyl)disulfidec is superior, and suitably used. Note that these disulfide silane coupling agents may be used alone, or two or more kinds of these may be used in combination.

The film forming resin is equivalent to a high molecular weight resin having an average molecular weight of 10000 or more, and, from a viewpoint of film formation property, preferably has an average molecular weight of approximately 10000 to 80000. Examples of the film forming resin include various resins, such as phenoxy resin, polyester resin, polyurethane resin, polyester urethane resin, acrylate resin, polyimide resin, and butyral resin, and these resins may be used alone, or two or more kinds of these may be used in combination. Among these, from viewpoints of film formation state, connection reliability, and the like, phenoxy resin is suitably used. A content of the film forming resin is usually 30 to 80 parts by mass, preferably 40 to 70 parts by mass with respect to 100 parts by mass of the anisotropic conductive composite.

The radical polymerizable resin is a substance having a functional group which is polymerized by a radical, and examples thereof include epoxy acrylate, urethane acrylate, and polyester acrylate, and these may be used alone, or two or more kinds of these may be used in combination. Among these, epoxy acrylate is preferably used in the present embodiment. A content of the radical polymerizable resin is usually 10 to 60 parts by mass, preferably 20 to 50 parts by mass with respect to 100 parts by mass of the anisotropic conductive composite.

As a radical polymerization initiator, a well-known initiator can be used, and in particular, an organic peroxide can be preferably used. Examples of the organic peroxide include peroxyketals, diacyl peroxides, peroxydicarbonates, peroxyesters, dialkyl peroxides, hydroperoxides, and silyl peroxides, and these may be used alone, or two or more kinds of these may be used in combination. Among these, peroxyketals are preferably used in the present embodiment. A content of the radical polymerization initiator is usually 0.1 to 30 parts by mass, preferably 1 to 20 parts by mass with respect to 100 parts by mass of the anisotropic conductive composite.

As an organic solvent to dissolve these, toluene, ethyl acetate, a mixed solvent obtained by mixing toluene with ethyl acetate, or other various organic solvents can be used.

As the conductive particles to be dispersed in the anisotropic conductive composite, for example, metal particles, such as nickel, gold, and copper, or particles obtained by plating a resin particle with gold can be used. From a viewpoint of connection reliability, an average particle diameter of the conductive particles is preferably 1 to 20 μm, more preferably 2 to 10 μm. Also, from viewpoints of connection reliability and insulation reliability, an average particle density of the conductive particles in the anisotropic conductive composite is preferably 1000 to 50000 particles/mm$^2$, more preferably 5000 to 30000 particles/mm$^2$.

2. Manufacturing Method of Anisotropic Conductive Material

Next, a manufacturing method of the above-mentioned anisotropic conductive material will be explained. The manufacturing method of the anisotropic conductive material in the present embodiment is such that a surface of the hydrophobic silica is surface-treated with the disulfide silane coupling agent, and said surface-treated silica particles are made to be contained.

First, the disulfide silane coupling agent is dissolved in a solvent, such as methyl ethyl ketone, whereby a treatment liquid is prepared. Next, the hydrophobic silica is added to this treatment liquid and the liquid is left standing, then, filtration is performed to recover silica particles, followed by vacuum drying, whereby the sulfide silane modified hydrophobic silica is obtained.

Then, the film forming resin, the radical polymerizable substance, the radical polymerization initiator, and the sulfide silane modified hydrophobic silica are mixed to obtain an adhesive composite, and the conductive particles are dispersed in the adhesive composite to obtain the anisotropic conductive material.

In the case where a sheet-like anisotropic conductive film is produced, the above-mentioned anisotropic conductive material is applied onto a release base material, such as PET (Poly Ethylene Terephthalate) to which a release agent, such as silicone, is applied, and the anisotropic conductive material on the release base material is dried using a heat oven, a heat-drying apparatus, or the like, whereby a layer having a predetermined thickness is formed.

In the case of manufacturing an anisotropic conductive material having a two-layer structure in which a conductive particle-containing layer containing the conductive particles and an insulating adhesive layer are laminated, a resin composite for the conductive particle-containing layer is applied on the release base material and dried to form the conductive particle-containing layer, and the insulating resin layer is formed in the same manner, and then the conductive particle containing layer and the insulating resin layer are bonded together, whereby the anisotropic conductive material can be manufactured. In this case, said sulfide silane modified hydrophobic silica may be contained in the insulating adhesive layer.

3. Connection Method

Next, a connection method of electronic components by using the above-mentioned anisotropic conductive material will be explained. The connection method of electronic components according to the present embodiment is such that the above-mentioned anisotropic conductive material is made to stuck on a terminal of a first electronic component, and a second electronic component is temporarily arranged on the anisotropic conductive film, and then, the second electronic component is pressed from above by a heat-pressing apparatus, whereby the terminal of the first electronic component is connected to a terminal of the second electronic component.

Thus, there is obtained a connection structure in which the terminal of the first electronic component is connected to the terminal of the second electronic component via the conductive particles dispersed in the anisotropic conductive material.

In the anisotropic conductive material according to the present embodiment, silica particles in which the surface of the hydrophobic silica is surface-treated with the disulfide silane coupling agent are contained, and therefore, the connection structure having excellent connection resistance and excellent adhesive strength can be obtained.

Here, examples of the first electronic component include an IZO (Indium Zinc Oxide) coating glass in which a glass substrate is coated with an IZO film, and a SiNx (silicon nitride) coating glass in which a glass substrate is coated with a SiNx film. Examples of the second electronic component include a COF (Chip On Film), and an IC (Integrated Circuit). According to the present embodiment, since the sulfide silane modified hydrophobic silica is mixed in the anisotropic conductive material, excellent adhesive strength can be obtained even in a SiNx coating glass having a flat surface.

EXAMPLES

4. Examples

Hereinafter, examples according to the present invention will be described, but the present invention is not limited to these examples. Here, an anisotropic conductive film was produced for each of Examples 1 to 6 and Comparative Examples 1 to 7. Then, a mounting structure was produced using the anisotropic conductive film, and continuity resistance and adhesive strength of the mounting structure were evaluated. Note that preservation stability test of the anisotropic conductive film, production of the mounting structure, measurement of the continuity resistance, and measurement of the adhesive strength were performed as follows.

[Preservation Stability Test]

The anisotropic conductive film for each of Example 3, Comparative Example 1, and Comparative Example 7 was introduced into an environmental oven at 40 degrees C. and 60% RH for 48 hours.

[Production of Mounting Structure]

Using the anisotropic conductive film for each of Examples 1 to 6 and Comparative Examples 1 to 7, a COF (base material for Chip On Film, 50 μm-pitched, Cu(8 μm-thick)-Sn plated, 38 μm-thick S' perflex base material) and a 0.7 mm-thick IZO (Indium Zinc Oxide) coating glass in which a glass substrate was coated with an IZO film were bonded together, whereby a mounting structure was completed. In addition, a COF and a 0.7 mm-thick SiNx (silicon nitride) coating glass in which a glass substrate was coated with a SiNx film were bonded together, whereby a mounting structure was completed.

[Measurement of Continuity Resistance]

For each of the mounting structure, a pressure cooker test (PCT) was performed to evaluate connection resistance. Each of the connection resistance at the initial stage and after the introduction at 85 degrees C. and 85% RH for 500 hours was measured using a digital multimeter (Digital Multimeter 7555, manufactured by Yokogawa Electric Corporation). The measurement was performed by applying a 1 mA current, using a 4-terminal method.

[Measurement of Adhesive Strength]

For each of the mounting structure, a pressure cooker test (PCT) was performed to evaluate adhesive strength. Each of adhesive strength at the initial stage and after the introduction at 85 degrees C. and 85% RH for 500 hours was measured using a tensile tester (RTC1201, manufactured by AMD). The measurement was performed by pulling up the COF at a speed of 50 mm/sec and a temperature of 90 degrees C.

Example 1

(Production of Sulfide Silane Modified Hydrophobic Silica A)

5 parts by mass of bis(3-(triethoxysilyl) propyl)disulfide (product name: KBE846, manufactured by Shin-Etsu Chemical Co., Ltd.) was dissolved in 100 parts by weight of methyl-ethyl-ketone, whereby a treatment liquid was prepared. Next, 10 parts by mass of dimethyl siloxane modified silica particles having an average particle diameter of 14 nm were added as hydrophobic silica to 105 parts by weight of this treatment liquid, and the treatment liquid was left standing at 70 degrees C. for 2 hours, and then filtration is performed to recover silica particles, followed by vacuum drying, whereby sulfide silane modified hydrophobic silica A was obtained.

(Production of Anisotropic Conductive Film)

42 parts by mass of phenoxy resin (product name: PKHC, manufactured by Tomoe Engineering Co., Ltd.) as a film forming resin, 40 parts by mass of epoxy acrylate (product name: EB600, manufactured by DAICEL-CYTEC Company Ltd.) as a radical polymerizable substance, 3 parts by mass of peroxyketal (product name: PERHEXA C, manufactured by NOF Corporation) as a radical polymerization initiator, and 15 parts by mass of the sulfide silane modified hydrophobic silica A were mixed, whereby an adhesive composite was obtained. Conductive particles (product name: AUL704, manufactured by Sekisui Chemical Co., Ltd.) were dispersed in this adhesive composite so that the particle density would be 5000 particles/mm$^2$, whereby an anisotropic conductive material was obtained. Then, by applying and drying the anisotropic conductive material onto a PET film, an anisotropic conductive film having a thickness of 20 μm was produced.

(Evaluation Result)

Continuity resistance of the mounting structure obtained by bonding the COF and the IZO coating glass together was measured, and as a result, the initial resistance was 4.5Ω, and the resistance after the introduction at 85 degrees C. and 85% RH for 500 hours was 7.2 Ω.

Adhesive strength of the mounting structure obtained by bonding the COF and the IZO coating glass together was measured, and as a result, the initial strength was 8.7 N/cm, and the strength after the introduction at 85 degrees C. and 85% RH for 500 hours was 6.7 N/cm. In addition, adhesive strength of the mounting structure obtained by bonding the COF and the SiNx coating glass together was measured, and as a result, the initial strength was 7.8 N/cm, and the strength after the introduction at 85 degrees C. and 85% RH for 500 hours was 8.4 N/cm. Table 1 shows these results.

Example 2

(Production of Anisotropic Conductive Film)

An anisotropic conductive film was produced in the same manner as in Example 1, except that an amount of the phenoxy resin (product name: PKHC, manufactured by Tomoe Engineering Co., Ltd.) contained was 46 parts by mass, and an amount of the sulfide silane modified hydrophobic silica A contained was 11 parts by mass.

(Evaluation Result)

Continuity resistance of the mounting structure obtained by bonding the COF and the IZO coating glass together was measured, and as a result, the initial resistance was 3.8Ω, and the resistance after the introduction at 85 degrees C. and 85% RH for 500 hours was 5.6 Ω.

Adhesive strength of the mounting structure obtained by bonding the COF and the IZO coating glass together was measured, and as a result, the initial strength was 8.8 N/cm, and the strength after the introduction at 85 degrees C. and 85% RH for 500 hours was 6.9 N/cm. In addition, adhesive strength of the mounting structure obtained by bonding the COF and the SiNx coating glass together was measured, and as a result, the initial strength was 7.7 N/cm, and the strength after the introduction at 85 degrees C. and 85% RH for 500 hours was 6.2 N/cm. Table 1 shows these results.

Example 3

(Production of Anisotropic Conductive Film)

An anisotropic conductive film was produced in the same manner as in Example 1, except that an amount of phenoxy resin (product name: PKHC, manufactured by Tomoe Engineering Co., Ltd.) contained was 49 parts by mass and an amount of the sulfide silane modified hydrophobic silica A contained was 8 parts by mass.

(Evaluation Result)

Continuity resistance of the mounting structure obtained by bonding the COF and the IZO coating glass together was measured, and as a result, the initial resistance was 3.0Ω, and the resistance after the introduction at 85 degrees C. and 85% RH for 500 hours was 4.7 Ω.

Adhesive strength of the mounting structure obtained by bonding the COF and the IZO coating glass together was measured, and as a result, the initial strength was 8.5 N/cm, and the strength after the introduction at 85 degrees C. and 85% RH for 500 hours was 6.5 N/cm. In addition, adhesive strength of the mounting structure obtained by bonding the COF and the SiNx coating glass together was measured, and as a result, the initial strength was 7.3 N/cm, and the strength after the introduction at 85 degrees C. and 85% RH for 500 hours was 5.6 N/cm. Table 1 shows these results.

Furthermore, there were measured continuity resistance and adhesive strength of a mounting structure obtained by bonding using an anisotropic conductive film introduced into an environmental oven at 40 degrees C. and 60% RH for 48 hours. When the continuity resistance of the mounting structure obtained by bonding the COF and the IZO coating glass together was measured, the initial resistance was 3.2Ω, and the resistance after the introduction at 85 degrees C. and 85% RH for 500 hours was 5.1 Ω.

When the adhesive strength of the mounting structure obtained by bonding the COF and the IZO coating glass together was measured, the initial strength was 8.3 N/cm, and the strength after the introduction at 85 degrees C. and 85% RH for 500 hours was 6.2 N/cm. In addition, when the adhesive strength of the mounting structure obtained by bonding the COF and the SiNx coating glass together was measured, the initial strength was 7.4 N/cm, and the strength after the introduction at 85 degrees C. and 85% RH for 500 hours was 5.8 N/cm. Table 2 shows these results.

Example 4

(Production of Anisotropic Conductive Film)

An anisotropic conductive film was produced in the same manner as in Example 1, except that an amount of the phenoxy resin (product name: PKHC, manufactured by Tomoe Engineering Co., Ltd.) contained was 52 parts by mass and an amount of the sulfide silane modified hydrophobic silica A contained was 5 parts by mass.

(Evaluation Result)

Continuity resistance of the mounting structure obtained by bonding the COF and the IZO coating glass together was measured, and as a result, the initial resistance was 2.6Ω, and the resistance after the introduction at 85 degrees C. and 85% RH for 500 hours was 4.2Ω.

Adhesive strength of the mounting structure obtained by bonding the COF and the IZO coating glass together was measured, and as a result, the initial strength was 7.8 N/cm, and the strength after the introduction at 85 degrees C. and 85% RH for 500 hours was 5.7 N/cm. In addition, adhesive strength of the mounting structure obtained by bonding the COF and the SiNx coating glass together was measured, and as a result, the initial strength was 8.8 N/cm, and the strength after the introduction at 85 degrees C. and 85% RH for 500 hours was 5.0 N/cm. Table 1 shows these results.

Example 5

(Production of Anisotropic Conductive Film)

An anisotropic conductive film was produced in the same manner as in Example 1, except that an amount of the phenoxy resin (product name: PKHC, manufactured by Tomoe Engineering Co., Ltd.) contained was 55 parts by mass and an amount of the sulfide silane modified hydrophobic silica A contained was 2 parts by mass.

(Evaluation Result)

Continuity resistance of the mounting structure obtained by bonding the COF and the IZO coating glass together was measured, and as a result, the initial resistance was 2.5Ω, and the resistance after the introduction at 85 degrees C. and 85% RH for 500 hours was 4Ω.

Adhesive strength of the mounting structure obtained by bonding the COF and the IZO coating glass together was measured, and as a result, the initial strength was 7.1 N/cm, and the strength after the introduction at 85 degrees C. and 85% RH for 500 hours was 5.1 N/cm. In addition, adhesive strength of the mounting structure obtained by bonding the COF and the SiNx coating glass together was measured, and as a result, the initial strength was 5.5 N/cm, and the strength after the introduction at 85 degrees C. and 85% RH for 500 hours was 4.0 N/cm. Table 1 shows these results.

Example 6

(Production of Sulfide Silane Modified Hydrophobic Silica B)

2.5 parts by mass of bis(3-(triethoxysilyl)propyl)disulfide (product name: KBE846, manufactured by Shin-Etsu Chemical Co., Ltd.) and 2.5 parts by mass of a non-sulfide silane coupling agent (product name: KBM-503, manufactured by Shin-Etsu Chemical Co., Ltd.) were dissolved in 100 parts by weight of methyl ethyl ketone, whereby a treatment liquid was prepared. Next, 10 parts by mass of dimethyl siloxane modified silica particles having an average particle diameter of 14 nm were added as hydrophobic silica to 105 parts by weight of this treatment liquid, and left standing at 70 degrees C. for 2 hours, and then filtration is performed to recover silica particles, followed by vacuum drying, whereby sulfide silane modified hydrophobic silica B was obtained.

(Production of Anisotropic Conductive Film)

49 parts by mass of phenoxy resin (product name: PKHC, manufactured by Tomoe Engineering Co., Ltd.) as a film forming resin, 40 parts by mass of epoxy acrylate (product name: EB600, manufactured by DAICEL-CYTEC Company Ltd.) as a radical polymerizable substance, 3 parts by mass of peroxyketal (product name: PERHEXA C, manufactured by NOF Corporation) as a radical polymerization initiator, and 8 parts by mass of the sulfide silane modified hydrophobic silica B were mixed, whereby an adhesive composite was obtained. Conductive particles (product name: AUL704, manufactured by Sekisui Chemical Co., Ltd.) were dispersed in this adhesive composite so that the particle density would be 5000 particles/mm$^2$, whereby an anisotropic conductive material was obtained. Then, by applying and drying the anisotropic conductive material onto a PET film, an anisotropic conductive film having a thickness of 20 μm was produced.

(Evaluation Result)

Continuity resistance of the mounting structure obtained by bonding the COF and the IZO coating glass together was measured, and as a result, the initial resistance was 3.1Ω, and the resistance after the introduction at 85 degrees C. and 85% RH for 500 hours was 4.7Ω.

Adhesive strength of the mounting structure obtained by bonding the COF and the IZO coating glass together was measured, and as a result, the initial strength was 7.7 N/cm, and the strength after the introduction at 85 degrees C. and 85% RH for 500 hours was 5.8 N/cm. In addition, adhesive strength of the mounting structure obtained by bonding the COF and the SiNx coating glass together was measured, and as a result, the initial strength was 6.9 N/cm, and the strength after the introduction at 85 degrees C. and 85% RH for 500 hours was 5.2 N/cm. Table 1 shows these results.

Comparative Example 1

(Production of Sulfide Silane Modified Hydrophilic Silica C)

5 parts by mass of bis(3-(triethoxysilyl)propyl)disulfide (product name: KBE846, manufactured by Shin-Etsu Chemical Co., Ltd.) was dissolved in 100 parts by weight of methyl ethyl ketone, whereby a treatment liquid was prepared. Next, 10 parts by mass of silica particles having an average particle diameter of 14 nm were added as hydrophilic silica to 105 parts by weight of this treatment liquid, and left standing at 70 degrees C. for 2 hours, and then filtration was performed to recover silica particles, followed by vacuum drying, whereby sulfide silane modified hydrophilic silica C was obtained.

(Production of Anisotropic Conductive Film)

49 parts by mass of phenoxy resin (product name: PKHC, manufactured by Tomoe Engineering Co., Ltd.) as a film forming resin, 40 parts by mass of epoxy acrylate (product name: EB600, manufactured by DAICEL-CYTEC Company Ltd.) as a radical polymerizable substance, 3 parts by mass of peroxyketal (product name: PERHEXA C, manufactured by NOF Corporation) as a radical polymerization initiator, and 8 parts by mass of the sulfide silane modified hydrophilic silica C were mixed, whereby an adhesive composite was obtained. Conductive particles (product name: AUL704, manufactured by Sekisui Chemical Co., Ltd.) were dispersed in this adhesive composite so that the particle density would be 5000 particles/mm$^2$, whereby an anisotropic conductive material was obtained. Then, by applying and drying the anisotropic conductive material onto a PET film, an anisotropic conductive film having a thickness of 20 μm was produced.

(Evaluation Result)

Continuity resistance of the mounting structure obtained by bonding the COF and the IZO coating glass together was measured, and as a result, the initial resistance was 6.3Ω, and the resistance after the introduction at 85 degrees C. and 85% RH for 500 hours was 9.3Ω.

Adhesive strength of the mounting structure obtained by bonding the COF and the IZO coating glass together was measured, and as a result, the initial strength was 8.2 N/cm, and the strength after the introduction at 85 degrees C. and 85% RH for 500 hours was 6.4 N/cm. In addition, adhesive strength of the mounting structure obtained by bonding the COF and the SiNx coating glass together was measured, and as a result, the initial strength was 6.2 N/cm, and the strength after the introduction at 85 degrees C. and 85% RH for 500 hours was 4.5 N/cm. Table 2 shows these results.

Furthermore, there were measured continuity resistance and adhesive strength of a mounting structure obtained by bonding using an anisotropic conductive film introduced into an environmental oven at 40 degrees C. and 60% RH for 48 hours. When the continuity resistance of the mounting structure obtained by bonding the COF and the IZO coating glass together was measured, the initial resistance was 6.7Ω, and the resistance after the introduction at 85 degrees C. and 85% RH for 500 hours was 9.6 Ω.

When the adhesive strength of the mounting structure obtained by bonding the COF and the IZO coating glass together was measured, the initial strength was 8.0 N/cm, and the strength after the introduction at 85 degrees C. and 85% RH for 500 hours was 6.2 N/cm. In addition, when the adhesive strength of the mounting structure obtained by bonding the COF and the SiNx coating glass together was measured, the initial strength was 6.0 N/cm, and the strength after the introduction at 85 degrees C. and 85% RH for 500 hours was 4.3 N/cm. Table 3 shows these results.

Comparative Example 2

(Production of Non-Sulfide Silane Modified Hydrophobic Silica D)

5 parts by mass of a silane coupling agent not having a disulfide bond but containing sulfur (product name: A-189, manufactured by Momentive Performance Materials Inc.) was dissolved in 100 parts by weight of methyl ethyl ketone, whereby a treatment liquid was prepared. Next, 10 parts by mass of dimethyl siloxane modified silica particles having an average particle diameter of 14 nm were added as hydrophobic silica to 105 parts by weight of this treatment liquid, and left standing at 70 degrees C. for 2 hours, and then filtration is performed to recover silica particles, followed by vacuum drying, whereby non-sulfide silane modified hydrophobic silica D was obtained.

(Production of Anisotropic Conductive Film)

An anisotropic conductive film was produced in the same manner as in Comparative Example 1, except that the non-sulfide silane modified hydrophobic silica D was used instead of the sulfide silane modified hydrophilic silica C.

(Evaluation Result)

Continuity resistance of the mounting structure obtained by bonding the COF and the IZO coating glass together was measured, and as a result, the initial resistance was 3.1Ω, and the resistance after the introduction at 85 degrees C. and 85% RH for 500 hours was 5.0Ω.

Adhesive strength of the mounting structure obtained by bonding the COF and the IZO coating glass together was measured, and as a result, the initial strength was 7.2 N/cm, and the strength after the introduction at 85 degrees C. and 85% RH for 500 hours was 5.1 N/cm. In addition, adhesive strength of the mounting structure obtained by bonding the COF and the SiNx coating glass together was measured, and as a result, the initial strength was 5.8 N/cm, and the strength after the introduction at 85 degrees C. and 85% RH for 500 hours was 3.8 N/cm. Table 2 shows these results.

Comparative Example 3

(Production of Sulfide Silane Modified Hydrophilic Silica E)

5 parts by mass of a silane coupling agent not having a disulfide bond but containing sulfur (product name: A-189, manufactured by Momentive Performance Materials Inc.) was dissolved in 100 parts by weight of methyl ethyl ketone, whereby a treatment liquid was prepared. Next, 10 parts by mass of silica particles having an average particle diameter of 14 nm were added as hydrophilic silica to 105 parts by weight of this treatment liquid, and left standing at 70 degrees C. for 2 hours, and then filtration is performed to recover silica particles, followed by vacuum drying, whereby sulfide silane modified hydrophilic silica E was obtained.

(Production of Anisotropic Conductive Film)

An anisotropic conductive film was produced in the same manner as in Comparative Example 1, except that the sulfide silane modified hydrophilic silica E was used instead of the sulfide silane modified hydrophilic silica C.

(Evaluation Result)

Continuity resistance of the mounting structure obtained by bonding the COF and the IZO coating glass together was measured, and as a result, the initial resistance was 8.3Ω, and the resistance after the introduction at 85 degrees C. and 85% RH for 500 hours was 11.3Ω.

Adhesive strength of the mounting structure obtained by bonding the COF and the IZO coating glass together was measured, and as a result, the initial strength was 7.1 N/cm, and the strength after the introduction at 85 degrees C. and 85% RH for 500 hours was 5.0 N/cm. In addition, adhesive strength of the mounting structure obtained by bonding the COF and the SiNx coating glass together was measured, and as a result, the initial strength was 4.8 N/cm, and the strength after the introduction at 85 degrees C. and 85% RH for 500 hours was 3.4 N/cm. Table 2 shows these results.

Comparative Example 4

(Production of Non-Sulfide Silane Modified Hydrophilic Silica F)

5 parts by mass of non-sulfide silane coupling agent (product name: KBM-503, manufactured by Shin-Etsu Chemical Co., Ltd.) was dissolved in 100 parts by weight of methyl ethyl ketone, whereby a treatment liquid was prepared. Next, 10 parts by mass of silica particles having an average particle diameter of 14 nm were added as hydrophilic silica to 105 parts by weight of this treatment liquid, and left standing at 70 degrees C. for 2 hours, and then filtration is performed to recover silica particles, followed by vacuum drying, whereby non-sulfide silane modified hydrophilic silica F was obtained.

(Production of Anisotropic Conductive Film)

An anisotropic conductive film was produced in the same manner as in Comparative Example 1, except that the non-sulfide silane modified hydrophilic silica F was used instead of the sulfide silane modified hydrophilic silica C.

(Evaluation Result)

Continuity resistance of the mounting structure obtained by bonding the COF and the IZO coating glass together was measured, and as a result, the initial resistance was 7.2Ω, and the resistance after the introduction at 85 degrees C. and 85% RH for 500 hours was 10.7Ω.

Adhesive strength of the mounting structure obtained by bonding the COF and the IZO coating glass together was measured, and as a result, the initial strength was 5.6 N/cm, and the strength after the introduction at 85 degrees C. and 85% RH for 500 hours was 4.0 N/cm. In addition, adhesive strength of the mounting structure obtained by bonding the COF and the SiNx coating glass together was measured, and as a result, the initial strength was 4.7 N/cm, and the strength after the introduction at 85 degrees C. and 85% RH for 500 hours was 3.2 N/cm. Table 2 shows these results.

Comparative Example 5

(Hydrophilic Silica G)
Hydrophilic silica G having an average particle diameter of 14 nm was used.
Production of Anisotropic Conductive Film
An anisotropic conductive film was produced in the same manner as in Comparative Example 1, except that the hydrophilic silica G was used instead of the sulfide silane modified hydrophilic silica C. Note that a silane coupling agent was not contained.
(Evaluation Result)
Continuity resistance of the mounting structure obtained by bonding the COF and the IZO coating glass together was measured, and as a result, the initial resistance was 8.6Ω, and the resistance after the introduction at 85 degrees C. and 85% RH for 500 hours was 12.3Ω.
Adhesive strength of the mounting structure obtained by bonding the COF and the IZO coating glass together was measured, and as a result, the initial strength was 4.5 N/cm, and the strength after the introduction at 85 degrees C. and 85% RH for 500 hours was 3.0 N/cm. In addition, adhesive strength of the mounting structure obtained by bonding the COF and the SiNx coating glass together was measured, and as a result, the initial strength was 1.5 N/cm, and the strength after the introduction at 85 degrees C. and 85% RH for 500 hours was 0.8 N/cm. Table 2 shows these results.

Comparative Example 6

(Hydrophobic Silica H)
Dimethyl siloxane modified hydrophobic silica H having an average particle diameter of 14 nm was used.
(Production of Anisotropic Conductive Film)
An anisotropic conductive film was produced in the same manner as in Comparative Example 1, except that the hydrophobic silica H was used instead of the sulfide silane modified hydrophilic silica C. Note that a silane coupling agent was not contained.
Continuity resistance of the mounting structure obtained by bonding the COF and the IZO coating glass together was measured, and as a result, the initial resistance was 3.2Ω, and the resistance after the introduction at 85 degrees C. and 85% RH for 500 hours was 5.1Ω.
Adhesive strength of the mounting structure obtained by bonding the COF and the IZO coating glass together was measured, and as a result, the initial strength was 4.7 N/cm, and the strength after the introduction at 85 degrees C. and 85% RH for 500 hours was 3.1 N/cm. In addition, adhesive strength of the mounting structure obtained by bonding the COF and the SiNx coating glass together was measured, and as a result, the initial strength was 2.5 N/cm, and the strength after the introduction at 85 degrees C. and 85% RH for 500 hours was 1.5 N/cm. Table 2 shows these results.

Comparative Example 7

(Production of Anisotropic Conductive Film)
An anisotropic conductive film was produced in the same manner as in Comparative Example 1, except that the sulfide silane modified hydrophilic silica C was not contained, and that 8 parts by mass of bis(3-(triethoxysilyl) propyl)disulfide (product name: KBE846, manufactured by Shin-Etsu Chemical Co., Ltd.) was contained.
(Evaluation Result)
Continuity resistance of the mounting structure obtained by bonding the COF and the IZO coating glass together was measured, and as a result, the initial resistance was 2.6Ω, and the resistance after the introduction at 85 degrees C. and 85% RH for 500 hours was 4.3 Ω.
Adhesive strength of the mounting structure obtained by bonding the COF and the IZO coating glass together was measured, and as a result, the initial strength was 7.1 N/cm, and the strength after the introduction at 85 degrees C. and 85% RH for 500 hours was 5.4 N/cm. In addition, adhesive strength of the mounting structure obtained by bonding the COF and the SiNx coating glass together was measured, and as a result, the initial strength was 5.5 N/cm, and the strength after the introduction at 85 degrees C. and 85% RH for 500 hours was 3.9 N/cm. Table 2 shows these results.
Furthermore, there were measured continuity resistance and adhesive strength of a mounting structure obtained by bonding using the anisotropic conductive film introduced into an environmental oven at 40 degrees C. and 60% RH for 48 hours. When the continuity resistance of the mounting structure obtained by bonding the COF and the IZO coating glass together was measured, the initial resistance was 2.7Ω, and the resistance after the introduction at 85 degrees C. and 85% RH for 500 hours was 4.5Ω.
When the adhesive strength of the mounting structure obtained by bonding the COF and the IZO coating glass together was measured, the initial strength was 6.5 N/cm, and the strength after the introduction at 85 degrees C. and 85% RH for 500 hours was 4.7 N/cm. In addition, when the adhesive strength of the mounting structure obtained by bonding the COF and the SiNx coating glass together was measured, the initial strength was 2.2 N/cm, and the strength after the introduction at 85 degrees C. and 85% RH for 500 hours was 0.8 N/cm. Table 3 shows these results.

TABLE 1

|  |  |  | Example 1 | Example 2 | Example 3 | Example 4 | Example 5 | Example 6 |
|---|---|---|---|---|---|---|---|---|
|  | Silica |  | A | A | A | A | A | B |
|  | Mixed Mass (parts by mass) |  | 15 | 11 | 8 | 5 | 2 | 8 |
| Continuity Resistance (Ω) | IZO | Initial Stage | 4.5 | 3.8 | 3.0 | 2.6 | 2.5 | 3.1 |
|  |  | After introduction at 85 degrees C. and 85% RH for 500 hr | 7.2 | 5.6 | 4.7 | 4.2 | 4.3 | 4.7 |

TABLE 1-continued

|  |  |  | Example 1 | Example 2 | Example 3 | Example 4 | Example 5 | Example 6 |
|---|---|---|---|---|---|---|---|---|
| Adhesive strength (N/cm) | IZO | Initial Stage | 8.7 | 8.8 | 8.5 | 7.8 | 7.1 | 7.7 |
|  |  | After introduction at 85 degrees C. and 85% RH for 500 hr | 6.7 | 6.9 | 6.5 | 5.7 | 5.1 | 5.8 |
|  | SiNx | Initial Stage | 7.8 | 7.7 | 7.3 | 8.8 | 5.5 | 6.9 |
|  |  | After introduction at 85 degrees C. and 85% RH for 500 hr | 8.4 | 6.2 | 5.6 | 5.0 | 3.7 | 5.2 |
| Overall Evaluation |  |  | Δ | ○ | ⊚ | ○ | Δ | Δ |

TABLE 2

|  |  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|
| Silica |  |  | C | D | E | F | G | H | w/o silica |
| Mixed Mass (parts by mass) |  |  | 8 | 8 | 8 | 8 | 8 | 8 | 8 |
| Continuity Resistance (Ω) | IZO | Initial Stage | 6.3 | 3.1 | 8.3 | 7.2 | 8.6 | 3.2 | 2.6 |
|  |  | After introduction at 85 degrees C. and 85% RH for 500 hr | 9.3 | 5.0 | 11.3 | 10.7 | 12.3 | 5.1 | 4.3 |
| Adhesive strength (N/cm) | IZO | Initial Stage | 8.2 | 7.2 | 7.1 | 5.6 | 4.5 | 4.7 | 7.1 |
|  |  | After introduction at 85 degrees C. and 85% RH for 500 hr | 6.4 | 5.1 | 5.0 | 4.0 | 3.0 | 3.1 | 5.4 |
|  | SiNx | Initial Stage | 6.2 | 5.8 | 4.8 | 4.7 | 1.5 | 2.5 | 5.5 |
|  |  | After introduction at 85 degrees C. and 85% RH for 500 hr | 4.5 | 3.8 | 3.4 | 3.2 | 0.8 | 1.5 | 3.9 |
| Overall Evaluation |  |  | X | X | X | X | X | X | X |

As for an overall evaluation, if continuity resistance after the introduction at 85 degrees C. and 85% RH for 500 hours with respect to the IZO coating glass was less than 5.0Ω, adhesive strength after the introduction at 85 degrees C. and 85% RH for 500 hours with respect to the IZO coating glass was not less than 6.0 N/cm; and adhesive strength after the introduction at 85 degrees C. and 85% RH for 500 hours with respect to the SiNx coating glass was not less than 5.0 N/cm, it was evaluated as ⊚.

If continuity resistance after the introduction at 85 degrees C. and 85% RH for 500 hours with respect to the IZO coating glass was less than 6.0 n; adhesive strength after the introduction at 85 degrees C. and 85% RH for 500 hours with respect to the IZO coating glass was not less than 5.5 N/cm; and adhesive strength after the introduction at 85 degrees C. and 85% RH for 500 hours with respect to the SiNx coating glass was not less than 5.0 N/cm, it was evaluated as ○. Furthermore, if continuity resistance after the introduction at 85 degrees C. and 85% RH for 500 hours with respect to the IZO coating glass was less than 8.0Ω, adhesive strength after the introduction at 85 degrees C. and 85% RH for 500 hours with respect to the IZO coating glass was not less than 5.0 N/cm, and adhesive strength after the introduction at 85 degrees C. and 85% RH for 500 hours with respect to the SiNx coating glass was not less than 4.0 N/cm, it was evaluated as Δ. A case except those mentioned above was evaluated as X.

TABLE 3

|  |  |  | Example 3 | Comparative Example 1 | Comparative Example 7 |
|---|---|---|---|---|---|
| Silica |  |  | A | C | w/o silica |
| Mixed Mass (parts by mass) |  |  | 8 | 8 |  |
| Continuity Resistance (Ω) | IZO | Initial Stage | 3.2 | 6.7 | 2.7 |
|  |  | After introduction at 85 degrees C. and 85% RH for 500 hr | 5.1 | 9.6 | 4.5 |

TABLE 3-continued

|  |  |  | Example 3 | Comparative Example 1 | Comparative Example 7 |
|---|---|---|---|---|---|
| Adhesive strength (N/cm) | IZO | Initial Stage | 8.3 | 8.0 | 6.5 |
|  |  | After introduction at 85 degrees C. and 85% RH for 500 hr | 6.2 | 6.2 | 4.7 |
|  | SiNx | Initial Stage | 7.4 | 6.0 | 2.2 |
|  |  | After introduction at 85 degrees C. and 85% RH for 500 hr | 5.8 | 4.3 | 0.8 |

As shown in Tables 1 to 3, the anisotropic conductive material in which the sulfide silane modified hydrophobic silica A or B was contained had lower continuity resistance and higher adhesive strength as compared to the anisotropic conductive material in which the sulfide silane modified hydrophilic silica C, the non-sulfide silane modified hydrophobic silica D, the sulfide silane modified hydrophilic silica E, the non-sulfide silane modified hydrophilic silica F, the hydrophilic silica G, or the hydrophobic silica H was contained. Furthermore, the anisotropic conductive material in which the sulfide silane modified hydrophobic silica A or B was contained controlled bleed-out and showed excellent preservation stability as compared to that of Comparative Example 7 in which silica was not contained but a disulfide silane coupling agent was contained.

Furthermore, as shown in Examples 1 to 5, when a content of the sulfide silane modified hydrophobic silica A was 2 to 15 parts by mass with respect to 100 parts by mass of the whole anisotropic conductive material, lower continuity resistance and higher adhesive strength were obtained.

REFERENCE SIGNS LIST

11 . . . glass substrate, 12 . . . metal wiring material, 13 . . . anisotropic conductive material, and 14 . . . hydrophobic silica.

The invention claimed is:

1. An anisotropic conductive material, comprising:
   sulfide silane modified hydrophobic silica particles having a surface treated by a disulfide silane coupling agent, and an average particle diameter of the sulfide silane modified hydrophobic silica particles is in the range from 10 nm to 300 nm.

2. The anisotropic conductive material according to claim 1, wherein a content of the sulfide silane modified hydrophobic silica particles is 2 to 15 parts by mass with respect to 100 parts by mass of the anisotropic conductive material.

3. The anisotropic conductive material according to claim 1, wherein the sulfide silane modified hydrophobic silica particles are silica particles that have been surface-modified with dimethyl siloxane.

4. The anisotropic conductive material according to claim 1, further comprising:
   a film forming resin,
   a radical polymerizable substance,
   a curing agent, and
   conductive particles.

5. A method for manufacturing an anisotropic conductive material, comprising:
   treating a surface of hydrophobic silica particles with a disulfide silane coupling agent to form surface treated hydrophobic silica particles, wherein an average silica particle diameter of the surface treated hydrophobic silica particles is in the range of from 10 to 300 nm, and
   dispersing the surface treated hydrophobic silica particles in a conductive material.

6. A connection method, comprising:
   sticking the anisotropic conductive material according to claim 1 on a terminal of a first electronic component,
   arranging a second electronic component on the anisotropic conductive film,
   pressing the second electronic component from above by a heat-pressing apparatus, and
   connecting the terminal of the first electronic component to a terminal of the second electronic component.

7. A bonded structure manufactured by the connection method according to claim 6.

* * * * *